United States Patent [19]

Majumdar et al.

[11] Patent Number: 5,703,399

[45] Date of Patent: Dec. 30, 1997

[54] SEMICONDUCTOR POWER MODULE

[75] Inventors: Gourab Majumdar; Tooru Iwagami; Sukehisa Noda, all of Toyko, Japan

[73] Assignee: Mitsubishi Denki Kabushiki Kaisha, Tokyo, Japan

[21] Appl. No.: 648,432

[22] Filed: May 15, 1996

[30] Foreign Application Priority Data

Nov. 15, 1995 [JP] Japan .................. 7-296457

[51] Int. Cl.$^6$ .................................................. H01L 23/34
[52] U.S. Cl. .................. 257/723; 257/724; 257/787; 257/796; 257/675
[58] Field of Search .................. 257/723, 724, 257/787, 745, 796, 666, 675

[56] References Cited

U.S. PATENT DOCUMENTS

| | | | |
|---|---|---|---|
| 5,057,906 | 10/1991 | Ishigami | 257/723 |
| 5,424,250 | 6/1995 | Sawada | 437/211 |
| 5,466,969 | 11/1995 | Tsunoda | 257/723 |

Primary Examiner—Tom Thomas
Assistant Examiner—Roy Potter
Attorney, Agent, or Firm—Oblon, Spivak, McClelland, Maier & Neustadt, P.C.

[57] ABSTRACT

A blanked lead frame serves both as an interconnection pattern for a control circuit and a power circuit and as external terminals. Highly heat conducting resin having an electric insulating property is put between the lead frame and the heat sink arranged to face each other to maintain good thermal conductivity therebetween. The heat sink and the lead frame are coupled easily and fixedly by performing a simple process of sealing with the highly heat conducting resin. Accordingly, no expensive circuit boards are required, which have been necessary in conventional devices, nor a process of patterning the interconnection pattern and a process of connecting the external terminals to the interconnection pattern when manufacturing the device required. That is to say, the manufacturing cost is reduced without deteriorating the heat radiating characteristic.

20 Claims, 11 Drawing Sheets

111

SEMICONDUCTOR POWER MODULE

BACKGROUND OF THE INVENTION

1. Field of the invention

The present invention relates to semiconductor power modules, and particularly to an improvement for compatibly realizing high heat radiation characteristic and manufacturing cost reduction.

2. Description of the Background Art

A semiconductor power module is a semiconductor device including a power circuit having a power semiconductor element for modulation-controlling a flow of the main current (the load current) as in the case of turning on and off (switching) the main current charged with supply of electric power to a load and a control circuit for controlling the operation of the power semiconductor element incorporated in a single device. The control circuit usually includes a driving circuit for driving the power semiconductor element and a protection circuit for protecting the element from damage when an abnormality occurs. This semiconductor power module is increasingly utilized for an invertor for controlling operation of a motor etc, or an uninterruptible power supply, for example.

The power circuit adopts a heat radiation structure because a large amount of heat is produced from the power semiconductor element in which the main current flows. On the other hand, the control circuit is a weak-current circuit in which only a weak current flows, so that the control circuit itself does not require a heat radiation structure. This way, while the semiconductor power module includes two circuits which require different structures in terms of the thermal characteristics provided in a single device, it is required to be sized as small as possible.

FIG. 18 is a front sectional view of a conventional semiconductor power module disclosed in Japanese Patent Laying-Open No.5-129515. In this conventional device, a heat-resistant epoxy insulating layer 52 is formed on an aluminum base plate 51, on which a metal foil 53 patterned into a certain form is provided. These members 51–53 form an insulating wiring board 70.

The power semiconductor element 55 is affixed with solder 54 in a certain position on the metal foil 53. Other parts of the metal foil 53 and the power semiconductor element 55 are electrically connected by the aluminum bonding wire 56. On the metal foil 53, a control circuit board 71 is fixed to occupy a certain area on the insulating wiring board 70.

The control circuit board 71 has an electrically insulating control circuit board body 59 formed of glass epoxy (an epoxy resin reinforced with glass fiber). The control circuit board body 59 has a shield layer 58 made of a copper foil formed on its lower surface, i.e., on the surface facing to the insulating wiring board 70, and an interconnection 60 made of a patterned copper foil formed on its other surface, i.e., on its upper surface. The control circuit board body 59 also has a through hole 61 for electrically connecting the shield layer 58 and the interconnection 60.

An epoxy adhesive agent 57 is applied between the shield layer 58 of the control circuit board 71 and the metal foil 53 of the insulating wiring board 70. This adhesive agent 57 fixes the control circuit board 71 on the insulating wiring board 70. On the interconnection 60, electronic parts 63 such as an integrated circuit element, a resistance element and a capacitance element (FIG. 18 shows an integrated circuit element as a representative example) are affixed with solder 62.

A plurality of terminals 64a (FIG. 18 shows one as representative example) made of copper for inputting or outputting the main current are fixed with the solder 65a on the metal foil 53 of the insulating wiring board 70. Furthermore, a plurality of terminals 64b (FIG. 18 shows one as a representative example) made of copper for inputting or outputting signals are affixed by the solder 65b on the interconnection 60 of the control circuit board 71. That is to say, the control circuit board 71 forms a control circuit with the electronic parts 63 etc. and the insulating wiring board 70 forms a power circuit with the power semiconductor element 55, the bonding wire 56, etc.

A frame-like case 66 formed of an insulator such as a resin is attached to surround the insulating wiring board 70. The insulating wiring board 70 engages with the bottom of the case 66 and they are coupled to each other with the adhesive agent 67. That is to say, the case 66 and the insulating wiring board 70 are arranged as if they formed a side and a bottom of a box opening on its top. The inside of this box, i.e., the internal portion surrounded by the insulating wiring board 70 and the case 66, is filled with sealing resin 68 for the purpose of protecting the power semiconductor element 55 and the like.

In this semiconductor power module constructed as described above, the loss heat produced in the power semiconductor element 55 is well transmitted to the aluminum base plate 51 and efficiently radiated to an external radiation plate attached to the aluminum base plate 51. The solder 54, the metal foil 53 and the insulating layer 52 interposed between the power semiconductor element 55 and the aluminum base plate 51 all having high thermal conductivity and formed sufficiently thin do not interfere with the conduction of the loss heat from the power semiconductor element 55 to the aluminum base plate 51.

This semiconductor power module is assembled in the following procedure. First, the insulating layer 52 is formed on the aluminum base plate 51 and the metal foil 53 is further formed on it. Then, the metal foil 53 is selectively etched for patterning. This forms the insulating wiring board 70. About that time, the metal foil on one main surface of a substrate, which has been obtained on the market in advance, is patterned into the form of the interconnection 60 to form the control circuit board 71.

Next, the shield layer 58 and the metal foil 53 are bonded with the adhesive agent 57 to fix the control circuit board 71 on the insulating wiring board 70. Next, the power semiconductor element 55 is soldered in a certain position on the metal foil 53 with the solder 54. Subsequently, the electronic parts 63 etc. are soldered in certain positions on the interconnection 60 with the solder 62 to form the control circuit. Next, the power semiconductor element 55 and the metal foil 53, etc. are wire-bonded with the aluminum wire 56 to form the power circuit.

Subsequently, the terminals 64a and 64b are soldered using the solder 65a, 65b in certain positions on the interconnection 60 and the metal foil 53. Then, the case 66 is affixed with the adhesive agent 67 to the insulating wiring board 70 and finally the inside surrounded by the case 66 and the insulating wiring board 70 is sealed in with the sealing resin 68 and then the device is completed.

The conventional device structured and manufactured as described above has such problems as shown below. First, since it uses two expensive kinds of circuit boards, i.e., the insulating wiring board 70 and the control circuit board 71, it has a problem of the high manufacturing cost. Furthermore, the manufacturing process of the device requires the process of patterning the metal foil 53 and the interconnection 60, and in addition, the process of preparing the terminals 64a, 64b as independent parts and the process of attaching them to the boards 70, 71 by soldering. That is to say, the manufacturing process of the device is complicated, which is also a factor of the high manufacturing cost.

SUMMARY OF THE INVENTION

A first aspect of the present invention is related to a semiconductor power module incorporating both circuits of a power circuit having a power semiconductor element and a control circuit for controlling the power semiconductor element. According to the present invention, the semiconductor power module includes: a lead frame with good electric conductivity and shaped like a sheet having one main surface and the other main surface, which forms an interconnection pattern having portions each belonging to each of both the circuits respectively and external terminals for making electric connection between each of both the circuits respectively and the outside, and on which one main surface circuit elements each belonging to each of both the circuits respectively are affixed; a heat sink with good thermal conductivity provided so that its main surface faces at least a portion belonging to the power circuit in the other main surface of the lead frame; and a sealing resin with an electric insulating property and good thermal conductivity for filling a gap between the lead frame and the heat sink to electrically insulate them from each other and fixedly couple them.

Preferably, according to a semiconductor power module of a second aspect of the present invention, the lead frame is flat over both of the circuits.

Preferably, according to a semiconductor power module of a third aspect of the present invention, with the portion belonging to the power circuit in the other main surface of the lead frame being regarded as a first portion, the heat sink is arranged so that the main surface of the heat sink also faces a second portion belonging to the control circuit in the other main surface of the lead frame.

Preferably, according to a semiconductor power module of a fourth aspect of the present invention, the lead frame bends to form a difference in level between the first portion so that the second portion and the second portion is more distant from the heat sink as compared with the first portion.

Preferably, according to a semiconductor power module of a fifth aspect of the present invention, the lead frame bends at an obtuse angle.

Preferably, according to a semiconductor power module of a sixth aspect of the present invention, the main surface of the heat sink bends to form a difference in level between a third portion facing the first portion and a fourth portion facing the second portion, with the fourth portion being more distant from the lead frame as compared with the third portion.

Preferably, according to a semiconductor power module of a seventh aspect of the present invention, the lead frame is flat over both of the circuits, and the main surface of the heat sink bends to form a difference in level between a third portion facing the first portion and a fourth portion facing the second portion with the fourth portion being more distant from the lead frame as compared with the third portion.

Preferably, according to a semiconductor power module of an eighth aspect of the present invention, the main surface of the heat sink bends at an obtuse angle.

Preferably, according to a semiconductor power module of a ninth aspect of the present invention, the second portion is divided into two portions and the power circuit and the control circuit are arranged so that the first portion is interposed between the two portions.

Preferably, according to a semiconductor power module of a tenth aspect of the present invention, the second portion is divided into two portions and the power circuit and the control circuit are arranged so that the first portion is interposed between the two portions, and the external terminals protrudes from the two portions in a direction opposite to the first portion.

Preferably, according to a semiconductor power module of an eleventh aspect of the present invention, the heat sink is provided only in a region facing the portion belonging to the power circuit in the other main surface of the lead frame.

Preferably, according to a semiconductor power module of a twelfth aspect of the present invention, a side of the heat sink opposite to the main surface is like a fin.

According to the device of the first aspect, the lead frame serves both as an interconnection wiring pattern and an external terminal. Accordingly, the processes required when manufacturing a conventional device, i.e., the process of patterning a metal foil on a circuit board to form an interconnection pattern, the process of separately preparing external terminals, and the process of affixing the external terminals to the interconnection pattern are replaced by the simple process of blanking the lead frame in the device of the invention.

Furthermore, in this device, the sealing resin filling the gap between the lead frame and the heat sink electrically insulates them. A simple sealing process enables the filling with the sealing resin. Hence, the device can be manufactured without using expensive circuit boards in simple processes.

Furthermore, the heat sink is provided facing a part of the lead frame which belongs at least to the power circuit and the electric insulating sealing resin interposed therebetween has good thermal conductivity. Accordingly, the loss heat generated in the power circuit is efficiently transmitted to the heat sink without deterioration as compared with the conventional device having circuit boards. That is to say, this device compatibly realizes the good heat radiating characteristic and reduction of manufacturing cost.

According to the device of the second aspect, the lead frame is flat over both of the power circuit and the control circuit. Accordingly, when manufacturing the device, the process of affixing the circuit elements including the power semiconductor element forming the power circuit and the circuit elements forming the control circuit on the lead frame can be achieved smoothly. Also, the process of wire-bonding these elements and the lead frame is achieved easily. That is to say, this device further reduces the manufacturing cost.

According to the device of the third aspect, the heat sink provided so as to face also to the portion belonging to the control circuit of the lead frame allows the loss heat generated in the power circuit to be further efficiently radiated to the outside through the heat sink.

According to the device of the fourth aspect, the lead frame has a difference in level so that it is close to the heat sink in the portion belonging to the power circuit and distant in the portion belonging to the control circuit. This suppresses invasion of electric noise into the control circuit through the heat sink without deteriorating the heat radiating characteristic of loss heat generated in the power circuit. That is to say, the noise resistance of the control circuit is improved.

Furthermore, as the sealing resin for filling the gap between the lead frame and the heat sink is thicker in part, the fluidity of the resin is enhanced in the process of sealing with the resin. Accordingly, since voids are not apt to form in the sealing resin, a desired breakdown voltage between the lead frame and the heat sink is stably obtained.

According to the device of the fifth aspect, the lead frame bending at an obtuse angle does not interfere with the flow of the sealing resin in the bending portion. That is to say, the fluidity of the sealing resin is further enhanced. This more stably provides a high breakdown voltage between the lead frame and the heat sink.

According to the device of the sixth aspect, a difference in level is provided both in the lead frame and the main surface of the heat sink so that the part of the lead frame belonging to the power circuit is close to the heat sink and the part belonging to the control circuit is distant therefrom. Hence, under the condition that the noise resistance of the control circuit is constant, the height of the device can be reduced. Or, under the condition that the height of the device is constant, the noise resistance of the control circuit can be further enhanced.

According to the device of the seventh aspect, a difference in level is provided on the main surface of the heat sink so that the part of the lead frame belonging to the power circuit is close to the heat sink and the part belonging to the control circuit is distant therefrom. This suppresses invasion of electric noise into the control circuit through the heat sink without deteriorating the radiating characteristic of loss heat generated in the power circuit. That is to say, the noise resistance of the control circuit is improved.

Also, since the sealing resin filling the gap between the lead frame and the heat sink is thicker in part, the fluidity of the resin is enhanced in the process of sealing with the resin. Accordingly, voids are not apt to form in the sealing resin and a desired breakdown voltage is stably obtained between the lead frame and the heat sink.

Furthermore, since the lead frame is flat, affixing the circuit elements and wire-bonding can be performed easily when manufacturing the device.

According to the device of the eighth aspect, since the main surface of the heat sink bends at an obtuse angle, the bending portion does not intercept the flow of the sealing resin. That is to say, the fluidity of the sealing resin is further enhanced. This further stably provides a high breakdown voltage between the lead frame and the heat sink.

According to the device of the ninth aspect, the control circuit is divided into two parts and the power circuit and the control circuit are arranged so that the power circuit is interposed between these two parts. Accordingly, the portion of the lead frame belonging to the power circuit faces the center of the heat sink. This allows the loss heat generated in the power circuit to be radiated to the outside more efficiently through the heat sink.

According to the device of the tenth aspect, the control circuit is divided into two parts and the power circuit and the control circuit are arranged so that the power circuit is interposed between these two parts. This allows the loss heat generated in the power circuit to be radiated to the outside more efficiently through the heat sink.

Furthermore, as the portions corresponding to the external terminals of the lead frame protrude from the two parts in the direction opposite to the power circuit, the external terminals and the heat sink are separated by the relatively thick part of the sealing resin. That is to say, as the creeping distance between the external terminal and the heat sink is long, the breakdown voltage between the lead frame and the heat sink is further enhanced.

According to the device of the eleventh aspect, the heat sink is provided only in the region facing the portion belonging to the power circuit in the lead frame. That is to say, a region with a relatively low degree of contribution to radiation of loss heat in the heat sink is removed. This compatibly provides excellent heat radiating characteristic and further reduction of manufacturing cost. Furthermore, as the heat sink does not exist in the region facing the portion of the lead frame belonging to the control circuit, noise resistance of the control circuit is further improved.

According to the device of the twelfth aspect, the heat sink having a portion like a fin on the side opposite to the main surface facing to the lead frame removes the need of mounting the heat sink on an external radiation fin. That is to say, procedure in use is simplified. Furthermore, the contact thermal resistance produced between the heat sink and the radiation fin is solved to provide excellent heat radiating characteristic.

The present invention has been made to solve the problems described above in the conventional device, and it is an object of the present invention to provide a semiconductor power module with easy manufacturing and reducible manufacturing cost without deteriorating the radiation efficiency of the power circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

<1. First Preferred Embodiment>

First, a semiconductor power module according to a first preferred embodiment will be described.

<1-1. Device Structure>

Figure 1:
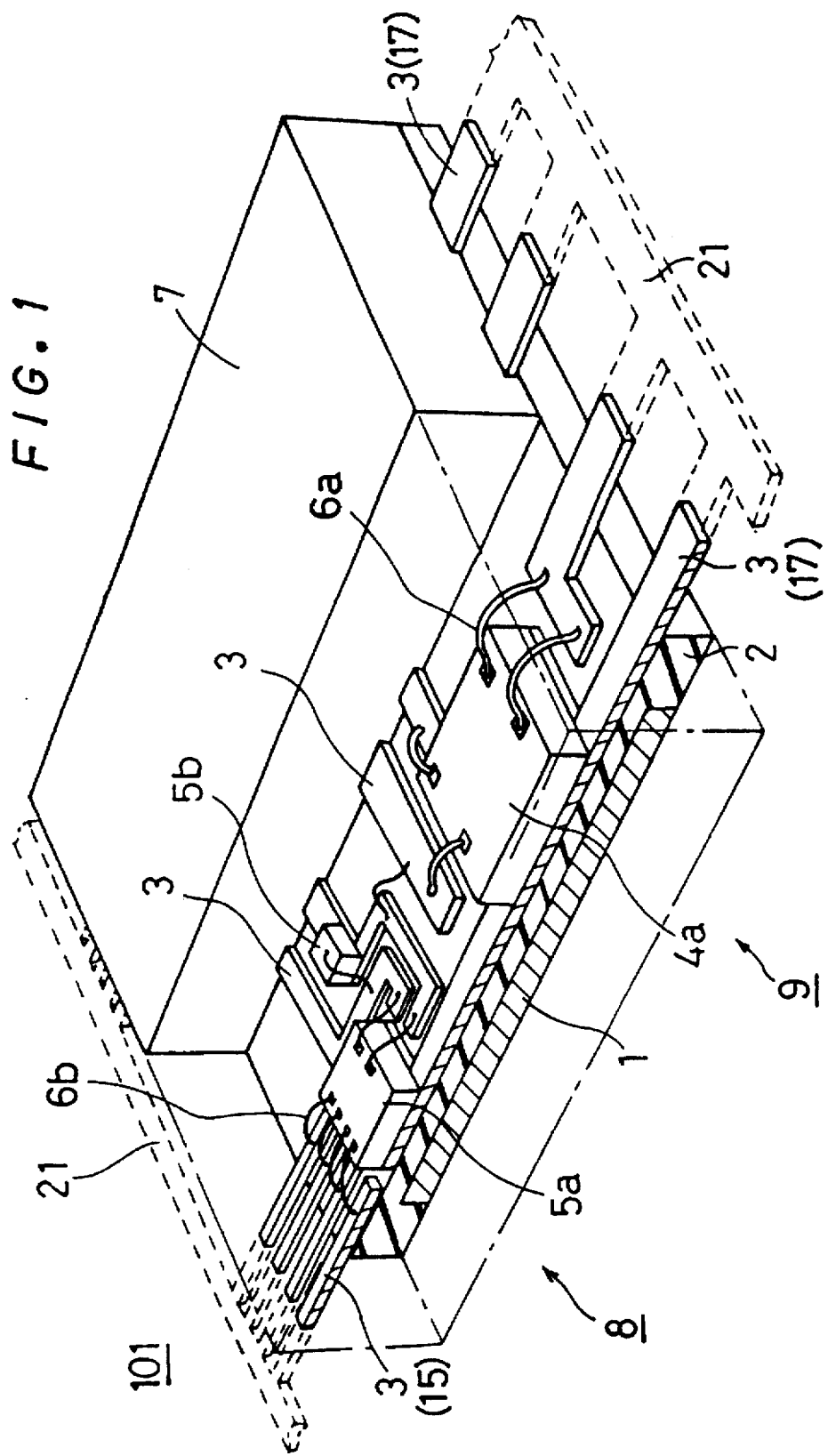
FIG. 1 is a partially cut perspective view of a device of a first preferred embodiment.
Figure 2:
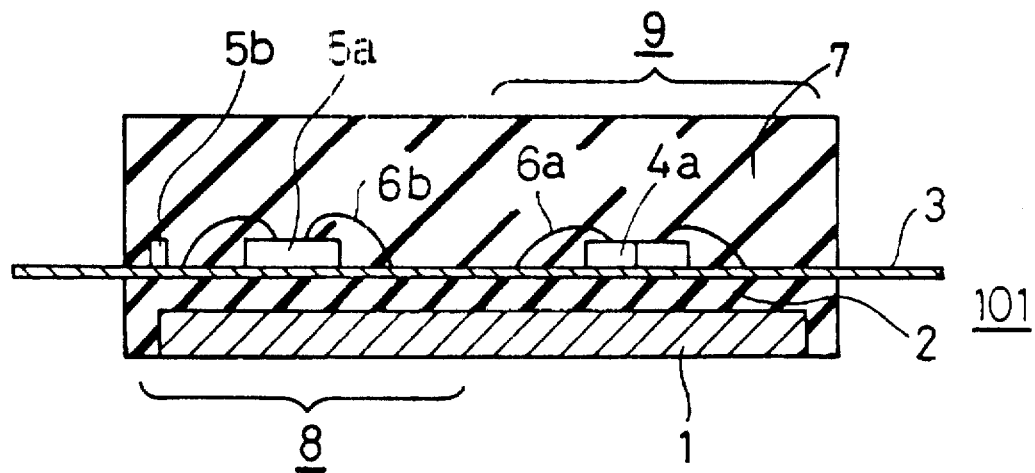
FIG. 2 is a front sectional view of the device of FIG. 1.

FIG. 1 and FIG. 2 are a partially cut perspective view and a front sectional view showing the structure of the semiconductor power module of the first preferred embodiment, respectively. This module 101 includes a power circuit 9 and a control circuit 8 for controlling the operation of the power circuit 9.

Figure 3:
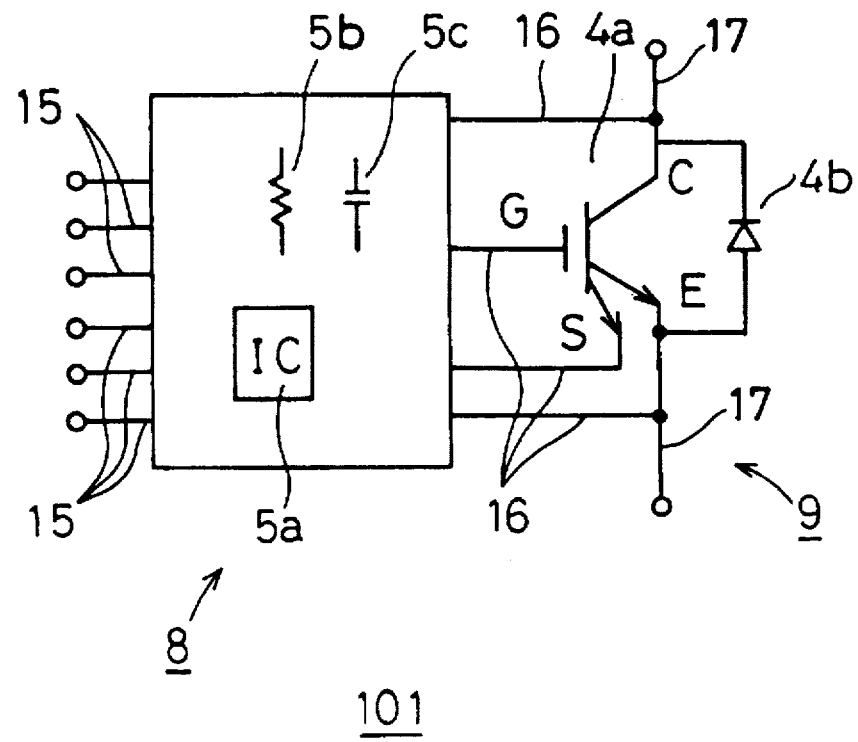
FIG. 3 is a circuit diagram of the device of FIG. 1.

The circuit diagram of FIG. 3 shows the circuit configuration of the module 101. The power circuit 9 includes an IGBT element 4a as a power switching element and a free wheel diode 4b. The IGBT element 4a conducts and cuts off the main current flowing from the collector electrode C to the emitter electrode E in response to the gate voltage signal inputted to the gate electrode G. This main current is supplied to an external load through the external terminal 17 connected to the collector electrode C and the emitter electrode E. The free wheel diode 4b connected to the IGBT element 4a in the inverse-parallel connection serves to prevent application of excessive reverse current to the IGBT element 4a.

The control circuit 8 connected to the power circuit 9 through a plurality of interconnections 16 includes an integrated circuit element 5a, a resistance element 5b, a capacitance element 5c, etc. These elements form a driving circuit and a protection circuit. The driving circuit is a circuit portion in the control circuit for transmitting the gate voltage signal to the gate electrode G in response to the control signal inputted to one of the plurality of external terminals 15. The protection circuit is a circuit portion for monitoring the operational environment of the IGBT element 4a to prevent damage to the IGBT element 4a when an abnormality occurs.

The protection circuit monitors the voltage between the collector electrode C and the emitter electrode E, i.e., the collector-emitter voltage and, when the voltage becomes too large above a certain reference value, it drives the gate electrode G to cut off the IGBT element 4a irrespective of the external control signal. The protection circuit also monitors the weak current flowing in the sense electrode S in proportion to the main current flowing in the IGBT element 4a, i.e., the sense current, and when the main current becomes too large above a certain reference value, it drives the gate electrode G to cut off the IGBT element 4a irrespective of the external control signal.

Furthermore, when an excessive voltage or an excessive current occurs, the protection circuit transmits a signal indicating the occurrence of an abnormality to the outside through the external terminals 15. This way, the protection circuit serves to protect the IGBT element 4a from damage caused by an abnormality such as an excessive voltage and an excessive current. Although the preferred example in which the control circuit 8 includes a driving circuit and a protection circuit has been described above, the control circuit 8 may generally include only a driving circuit.

Referring to FIG. 1 and FIG. 2 again, various elements included in the control circuit 8 and the power circuit 9 are soldered in a plurality of portions on the lead frame 3 formed of metal with good electric conductivity, such as copper. FIG. 1 and FIG. 2 shows the IGBT element 4a, the integrated circuit element 5a and the resistance element 5b as representatives of these elements. These elements are preferably formed as bare chip elements (circuit elements formed of naked chips which are not molded with resin etc.) as shown in FIG. 1 and FIG. 2.

The respective elements in the power circuit 9 and other portions of the lead frame 3 are electrically connected by the aluminum bonding wires 6a. Similarly, the respective elements in the control circuit 8 and still other portions of the lead frame 3 are electrically connected by the gold bonding wires 6b.

Figure 18:
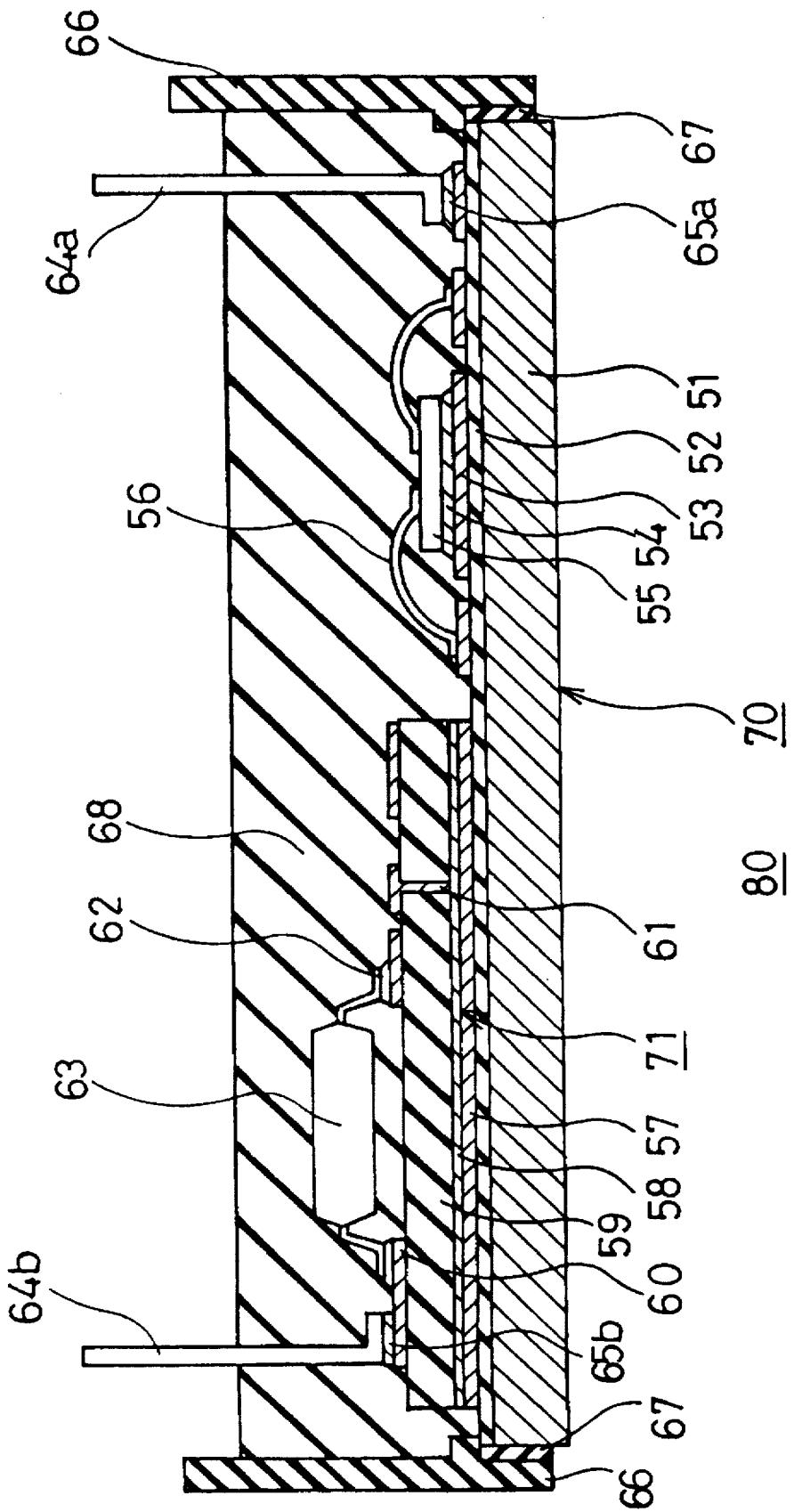
FIG. 18 is a front sectional view of a conventional device.

The lead frame 3 forms the interconnection wiring pattern of the control circuit 8 and the power circuit 9 including the interconnection 16 and also forms the external terminals 15 and the external terminals 17. That is to say, the lead frame 3 combines the metal foil 3, the interconnection 16 and the terminals 64a, 64b in the conventional device shown in FIG. 18. The periphery of the lead frame 3 prepared in the manufacturing process has a tie bar 21 shown by the broken line in FIG. 1, which integrally couples the entirety. After sealing with the highly heat conducting resin 2 and the insulating resin 7 described later is completed, the tie bar 21 is cut off to release the coupling, and then the lead frame 3 is separated into a plurality of independent portions.

The lead frame 3 is provided on the top surface of the highly heat conducting resin 2 and a sheet-like heat sink 1 formed of metal with good thermal conductivity such as copper is provided right under it, opposing in parallel to the lead frame 3 with the highly heat conducting resin 2 interposed therebetween. The highly heat conducting resin 2 is composed of a kind of composite material composed of epoxy resin with fillers mixed therein, as of alumina or aluminum nitride with precisely adjusted particle size, for example. This material has the excellent electric insulating property and also has thermal conductivity still higher than that of the known material composed of epoxy resin and fillers of silica mixed therein.

The highly heat conducting resin 2 fixedly couples the lead frame 3 and the heat sink 1. The highly heat conducting resin 2 electrically insulates the lead frame 3 and the heat sink 1 from each other and well conducts the loss heat produced in the IGBT element 4a from the lead frame 3 to the heat sink 1. The thickness of the highly heat conducting resin 2 interposed between the lead frame 3 and the heat sink 1 is limited to such a thickness as will not interfere with the good thermal conduction from the lead frame 3 to the heat sink 1.

In ordinary use, the heat sink 1 is provided with a radiation member, such as a cooling fin. The loss heat transmitted to the heat sink 1 is radiated to the radiation member.

The top surface of the highly heat conducting resin 2 is covered with an insulating resin 7 composed of a resin with excellent electrically insulating property and heat resistance, such as the epoxy resin, for example. The insulating resin 7 seals the elements included in the control circuit 8 and the power circuit 9, the bonding wires 6a, 6b and the lead frame 3 except the projecting portions corresponding to the external terminals 15 and the external terminals 17 of the lead frame 3. This protects the parts from external moisture etc.

<1-2. Manufacturing Method of Device>

Figure 4:
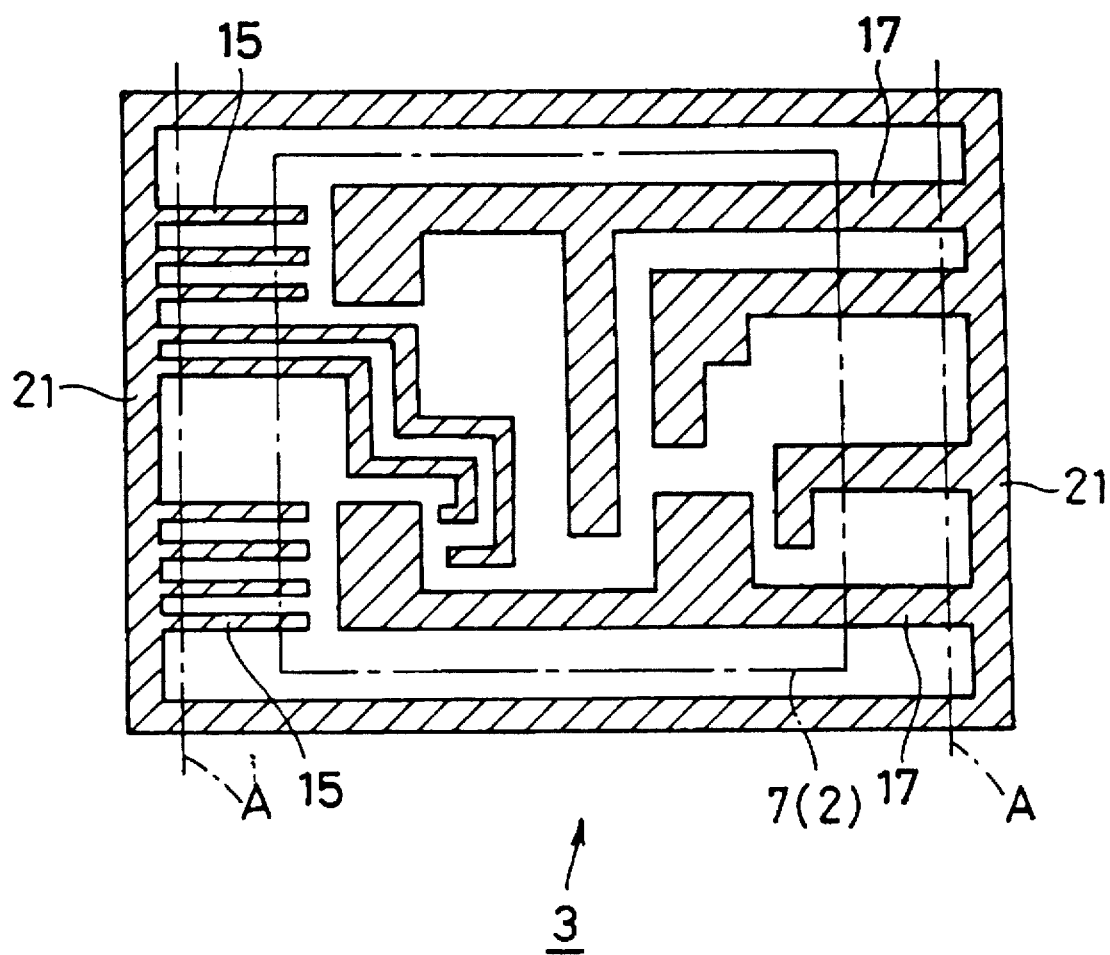
FIG. 4 is a plan view of the lead frame of the device of FIG. 1.

This module 101 is manufactured by the following method. First, the lead frame 3 shown in the plan view of FIG. 4 is prepared. The lead frame 3 is easily obtained by blanking a metal sheet with good electric conductivity such as copper into a certain pattern configuration. The lead frame 3 prepared in this process has the tie bar 21 for integrally coupling the entirety. Accordingly, the lead frame 3 can be handled as a member integrally coupled through all the processes until the tie bar 21 is cut off in the final process.

Next, as shown in FIG. 1, elements are affixed on the lead frame 3 and then wire-bonding with the bonding wires 6a, 6b is applied thereto. Subsequently, it is sealed with the insulating resin 7 using a mold.

Figure 5:
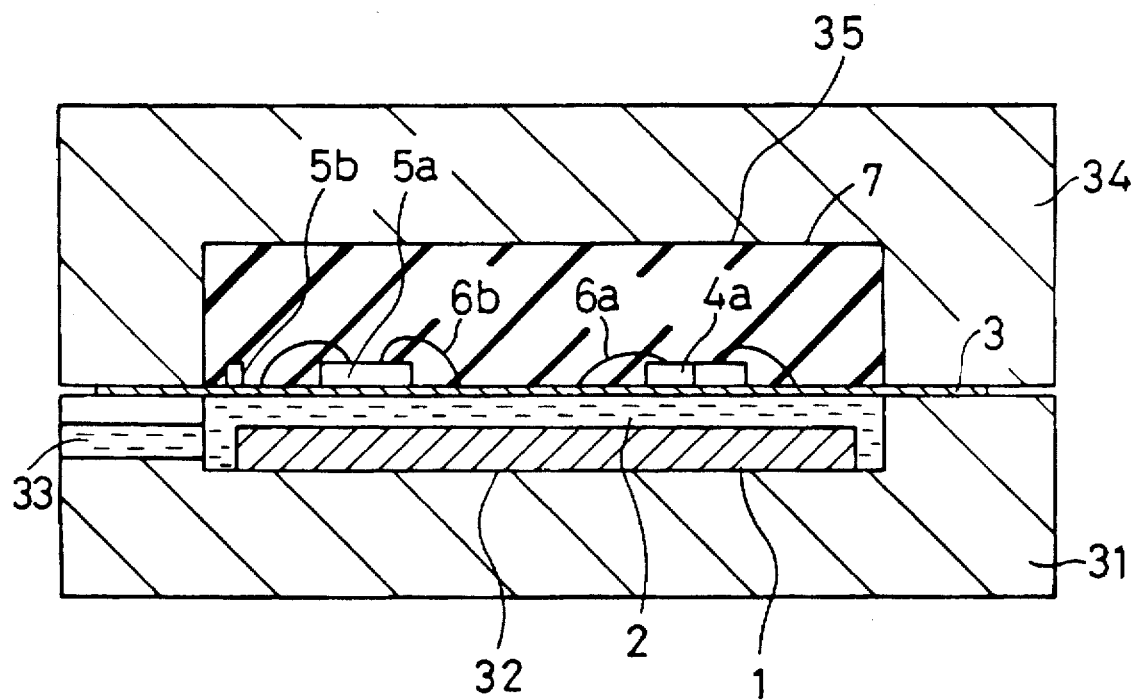
FIG. 5 is a process diagram showing one process for manufacturing the device of FIG. 1.

Then, in the manner shown in the front section of FIG. 5, sealing with the highly heat conducting resin 2 is carried out. As shown in FIG. 5, an upper mold 34 having a cavity 35 and a lower mold 31 having a cavity 32 are previously prepared for sealing with the highly heat conducting resin 2. The one cavity 35 is formed into such a shape as can easily accommodate the insulating resin 7 and the other cavity 32 is formed into a shape to be in close contact with the heat sink 1 and the highly heat conducting resin 2. The lower mold 31 has an injection path 33 communicating with the cavity 32.

With the heat sink 1 located in a certain position on the bottom of the cavity 32 and the insulating resin 7 accommodated in the cavity 35, the lower mold 31 and the upper mold 34 are closed. Then, the highly heat conducting resin 2 in a liquid state is injected through the injection path 33 and heated to cure to seal it in with the highly heat conducting resin 2. This process fixedly couples the heat sink 1, the highly heat conducting resin 2 and the lead frame 3 to each other.

Since the lead frame 3 is coupled with the insulating resin 7 in advance, the lead frame 3 is not liable to deflection transformation in the process of sealing with the highly heat conducting resin 2. Accordingly, a desired interval and parallelism between the lead frame 3 and the heat sink 1 can be obtained easily and precisely.

The insulating resin 7 and the highly heat conducting resin 2 cover the center region of the lead frame 3 shown by the one-dot chain line in FIG. 4 after the sealing is completed. The portion corresponding to the external terminals 15 and the external terminals 17 and the tie bar 21 are exposed to the outside of the insulating resin 7 and the highly heat conducting resin 2. When the sealing with the resins has been completed, the lead frame 3 is cut along the cut lines designated at the reference character A in FIG. 4 to remove the tie bar 21. This final process separates the plurality of external terminals 15 and 17 from each other, which have been integrally coupled, and then the module 101 is completed.

<1-3. Advantages of Device>

The module 101 configured and manufactured as described above has advantages as follows. First, unlike the conventional device, it does not need the process of patterning the metal foil 3 and the interconnection 60, the process of preparing the terminals 64a, 64b and the process of affixing the terminals 64a, 64b in certain positions on the metal foil 3 and the interconnection 60. These complicated processes are replaced by the simple process of just stamping the lead frame 3. That is to say, the module 101 has the advantage of a simple manufacturing process.

Furthermore, the process of sealing with the highly heat conducting resin 2 is easy and the interval and parallelism between the lead frame 3 and the heat sink 1 can be adjusted easily and precisely. Hence, it realizes excellent heat radiating characteristic without using the two expensive kinds of circuit boards in the conventional device, i.e., the insulating wiring board 70 and the control circuit board 71. That is to say, the module 101 compatibly realizes excellent heat radiating characteristic and manufacturing cost reduction.

Moreover, unlike the conventional device, the module 101 does not require the case 66, but it achieves protection of the inside of the device only by sealing it with the insulating resin 7 and the highly heat conducting resin 2. This also contributes to the reduction in manufacturing cost.

Furthermore, the lead frame 3 is flat through both the control circuit 8 and the power circuit 9. That is to say, the difference in level between the metal foil 53 of the power circuit and the interconnection 60 of the control circuit in the conventional device is eliminated in the module 101. Hence, the process of affixing the elements such as the IGBT element 4a, the integrated circuit element 5a, etc. on the lead frame 3 can be performed smoothly. The process of wire-bonding with the bonding wires 6a, 6b can also be achieved smoothly. That is to say, this also facilitates the manufacturing process and reduces the manufacturing cost.

<2. Second Preferred Embodiment>

Figure 6:
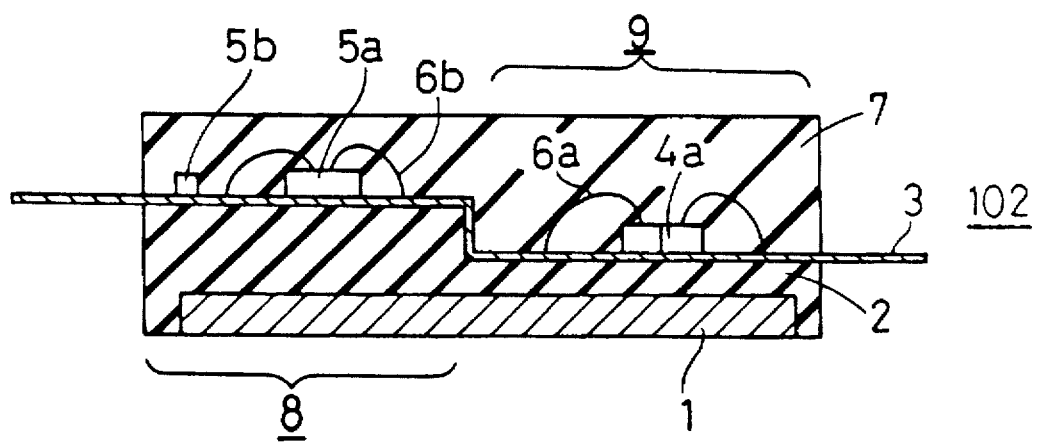
FIG. 6 is a front sectional view of a device of a second preferred embodiment.

FIG. 6 is a front section showing the structure of a semiconductor power module of a second preferred embodiment. In the following figures, portions the same as or corresponding (having the same functions) to those in the device of the first preferred embodiment shown in FIG. 1 to FIG. 5 are allotted with the same reference characters and a detailed description thereof is not repeated.

In this module 102, the lead frame 3 has a difference in level between the region belonging to the control circuit 8 and the region belonging to the power circuit 9. The thickness of the highly heat conducting resin 2 interposed between the lead frame 3 and the heat sink 1 is small in the region of the power circuit 9 and large in the region of the control circuit 8. This suppresses the thermal resistance between the portion corresponding to the power circuit 9 in the lead frame 3 and the heat sink 1 low, which keeps the good thermal conductivity characteristic therebetween. At the same time, this reduces the capacitive coupling between the portion corresponding to the control circuit 8 which requires no thermal radiation and the heat sink 1 (electric coupling through the parasitic capacitance parasitically produced in the highly heat conducting resin 2).

This suppresses the bad influence that the electric noise caused by switching operation of the IGBT element 4a invades the integrated circuit element 5a through the heat sink 1 to cause malfunction of the control circuit 8. In addition, this effectively suppresses malfunction of the control circuit 8 due to the electric noise invading through the external cooling fin (not shown) attached to the heat sink 1. That is to say, the module 102 can exclude effects of electric noise without deteriorating the heat radiating characteristic to realize stable operation of the control circuit 8.

Figure 7:
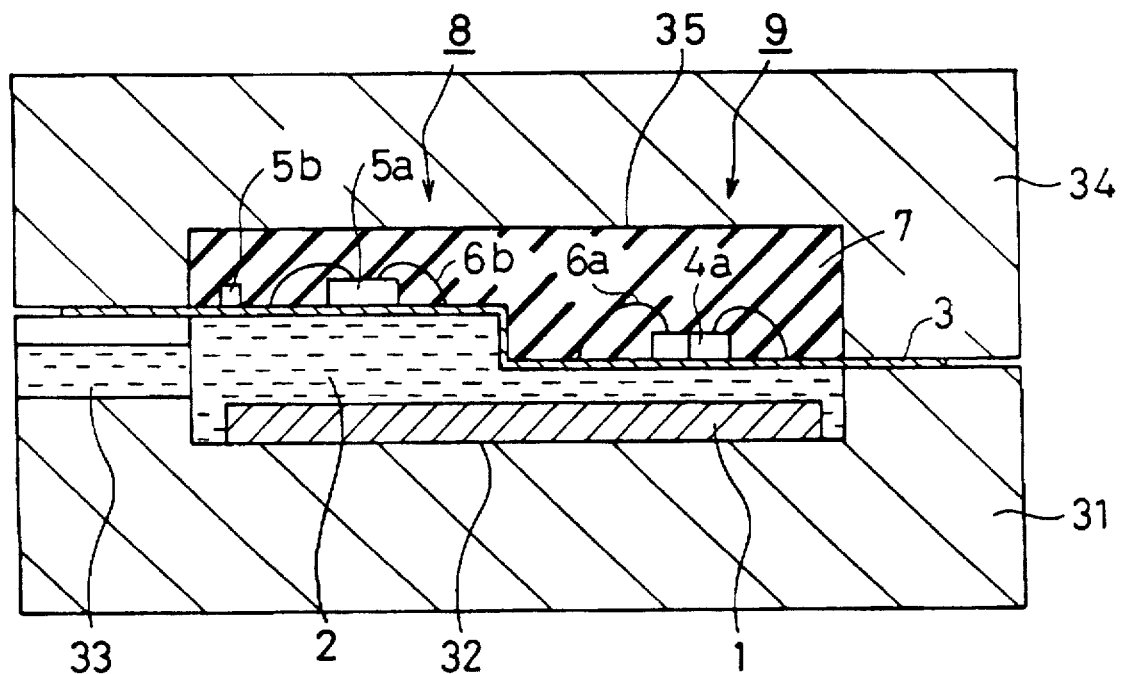
FIG. 7 is a process diagram showing one process for manufacturing the device of FIG. 6.

Furthermore, the difference in level in the lead frame 3 also serves to facilitate injection of the highly heat conducting resin 2 in the sealing process. The front section of FIG. 7 shows this. As shown in FIG. 7, the liquid resin injected from the injection path 33 in the process of sealing with the highly heat conducting resin 2 penetrates into the gap between the lead frame 3 and the heat sink 1 to fill the gap. At this time, as the interval between the lead frame 3 and the heat sink 1 is larger in the region of the control circuit 8, fluidity of the injected resin is good.

That is to say, since the region with the small interval between the lead frame 3 and the heat sink 1 is limited to the region of the power circuit 9, the sealing resin smoothly flows into the small gap between the lead frame 3 and the heat sink 1 in this region. This suppresses production of voids in the highly heat conducting resin 2, so that a high breakdown voltage between the lead frame 3 and the heat sink 1 is stably realized with suppressed variation (deviation) among products.

<3. Third Preferred Embodiment>

Figure 8:
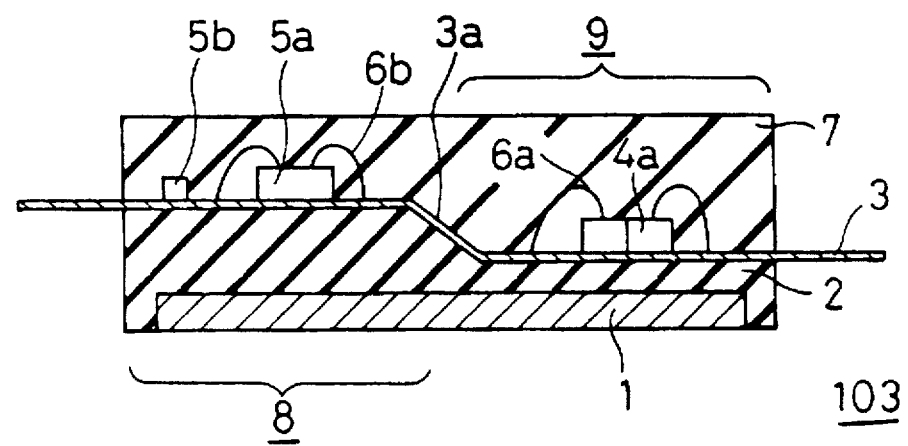
FIG. 8 is a front sectional view of a device of a third preferred embodiment.

FIG. 8 is a front sectional view showing the structure of a semiconductor power module according to a third preferred embodiment. In this module 103, similarly to the module 102, the lead frame 3 has a difference in level between the region belonging to the control circuit 8 and the region belonging to the power circuit 9. However, it is characteristically different from the module 102 in that the lead frame 3 does not bend at a right angle in the bending portion 3a but it bends at a gentle angle, i.e., at an obtuse angle grater than 90°, to form a slope between the different levels.

Accordingly, the sealing resin is led more smoothly from the region of the control circuit 8 with a large interval to the region of the power circuit 9 with a narrow interval in the process of sealing with the highly heat conducting resin 2. That is to say, the flow of the sealing resin is not intercepted at the bending portion 3a, which provides the advantage that the fluidity of the sealing resin is further enhanced. This more stably realizes the high breakdown voltage between the lead frame 3 and the heat sink 1.

<4. Fourth Preferred Embodiment>

Figure 9:
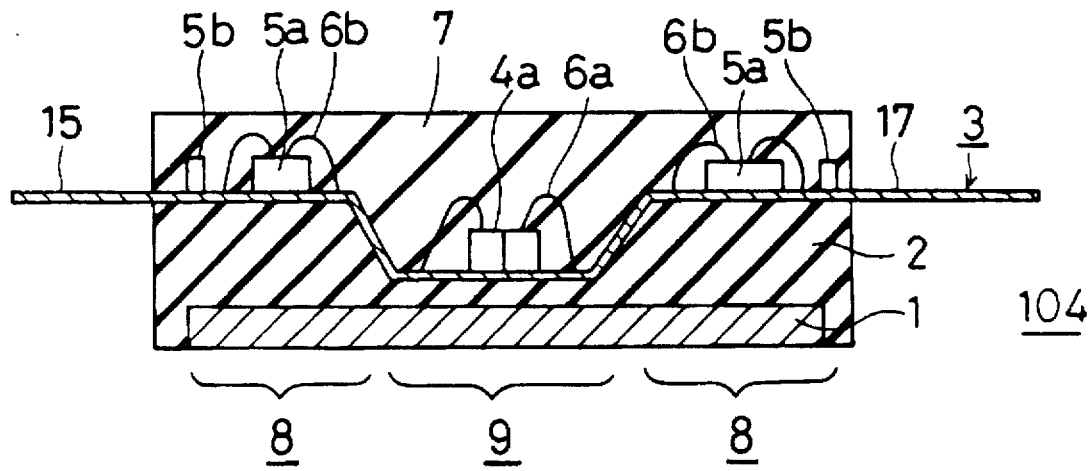
FIG. 9 is a front sectional view of a device of a fourth preferred embodiment.

FIG. 9 is a front sectional view showing the structure of a semiconductor power module according to a fourth preferred embodiment. In this module 104, similarly to the module 103, the lead frame 3 has a difference in level between the region belonging to the control circuit 8 and the region belonging to the power circuit 9, which bends at a gentle angle at the bending portion. However, it characteristically differs from the module 103 in that the power circuit 9 is provided in the center and the control circuit 8 is separated on both sides thereof. The thickness of the highly heat conducting resin 2 separating the lead frame 3 and the heat sink 1 is small in the center and large on both sides thereof.

Hence, a relatively small part of the heat sink 1 is distant from the region of the power circuit 9, and the entire part of the heat sink 1 is further closer to the region of the power circuit 9 as compared with the module 103. Accordingly, the loss heat produced in the power circuit 9 is more efficiently radiated to the outside through the heat sink 1. That is to say, the module 104 has the advantage of further improving the heat radiating efficiency.

Furthermore, the external terminals 15 and 17 protruding to the outside from the control circuit 8 disposed on both sides of the power circuit 9 and the heat sink 1 are separated by the relatively thick portion of the highly heat conducting resin 2. That is to say, the creeping distance between the external terminals 15 and 17 and the heat sink 1 is long. Accordingly, it has the advantage that the breakdown voltage between the lead frame 3 and the heat sink 1 is further enhanced.

<5. Fifth Preferred Embodiment>

Figure 10:
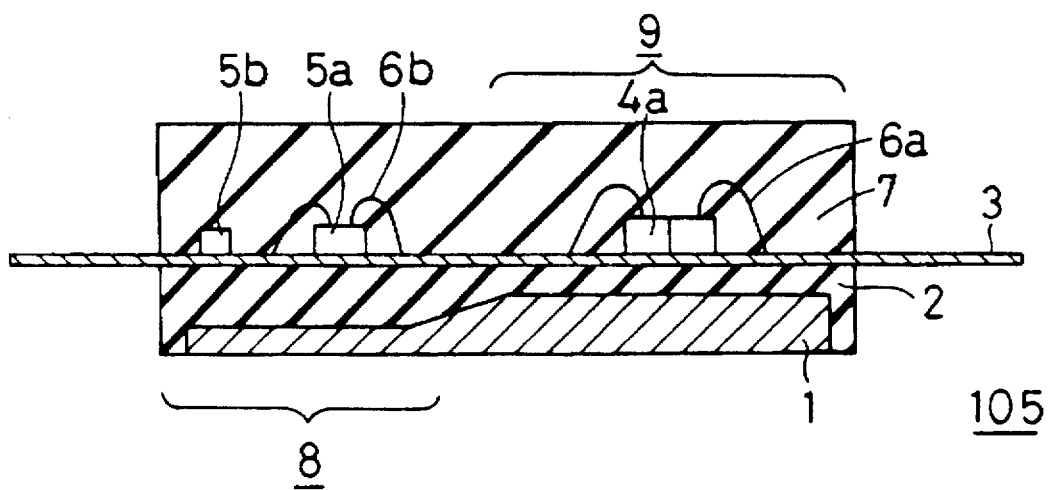
FIG. 10 is a front sectional view of a device of a fifth preferred embodiment.
Figure 11:
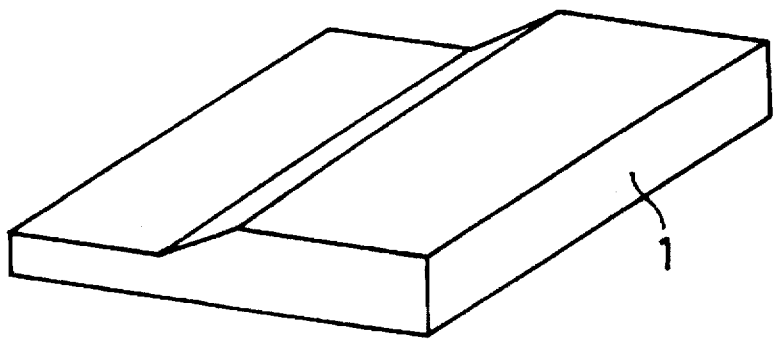
FIG. 11 is a perspective view of the heat sink of the device of FIG. 10.

FIG. 10 is a front sectional view showing the structure of a semiconductor power module according to a fifth preferred embodiment. FIG. 11 is a perspective view of the heat sink 1 belonging to this module 105. As shown in FIG. 10 and FIG. 11, in the module 105, the lead frame 3 is flat but the top surface of the heat sink 1, i.e., the surface facing the lead frame 3, has a difference in level to make the thickness of the highly heat conducting resin 2 differ by steps between the control circuit 8 and the power circuit 9.

Since the thickness of the highly heat conducting resin 2 is also set smaller in the power circuit 9 and larger in the control circuit 8 in the module 105, it compatibly realizes the good heat radiating characteristic of the power circuit 9 and the noise-resistance characteristic of the control circuit 8. Furthermore, the top surface of the heat sink 1 bending at a gentle angle, i.e., at an obtuse angle, to form a slope between different levels provides the advantage that the fluidity of the sealing resin is good in the process of sealing with the highly heat conducting resin 2. As has been already mentioned, this stably realizes a high breakdown voltage between the lead frame 3 and the heat sink 1.

Moreover, as the lead frame 3 has no difference in level but is flat over the control circuit 8 and the power circuit 9, it has the advantage that various elements such as the IGBT element 4a, the integrated circuit element 5a, etc. can easily be affixed on the lead frame 3 and the wire bonding with the bonding wires 6a, 6b can also be made easily. That is to say, the module 105 of this preferred embodiment compatibly realizes the advantages of both the first preferred embodiment and the third preferred embodiment.

<6. Sixth Preferred Embodiment>

Figure 12:
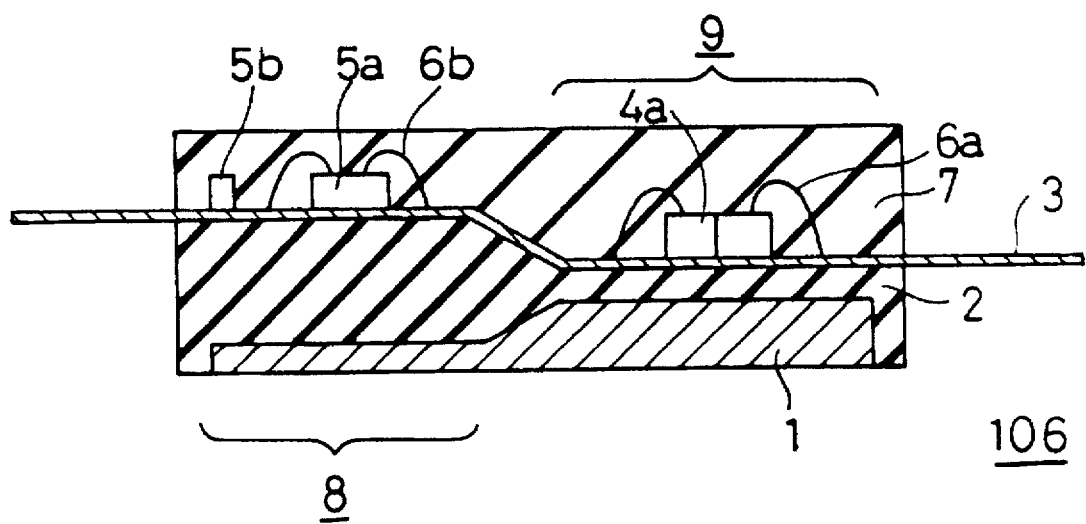
FIG. 12 is a front sectional view of a device of a sixth preferred embodiment.

FIG. 12 is a front sectional view showing the structure of a semiconductor power module according to a sixth preferred embodiment. In this module 106, both the top surface of the heat sink 1 and the lead frame 3 have a difference in level so that the thickness of the highly heat conducting resin 2 differs in steps between the control circuit 8 and the power circuit 9. Accordingly, under the condition of the same height of the module, the interval between the lead frame 3 and the heat sink 1 in the control circuit 8 can be made further wider to further enhance the noise resistance of the control circuit 8.

The thickness of the heat sink 1 has the most suitable value for effectively radiating the loss heat from the power circuit 9, and the heat radiation efficiency is decreased if it becomes too thick exceeding a certain limit. Accordingly, there is a certain limit in size of the difference in level formed in the heat sink 1, i.e., in the difference in height of the top surface. In the module 106 in which the lead frame 3 also has a difference in level, the difference in thickness of the highly heat conducting resin 2 between the power circuit 9 and the control circuit 8 can be enlarged to such an extent as can not be implemented only with the difference in level of the heat sink 1. That is to say, the noise resistance of the control circuit 8 can be further improved.

As shown in FIG. 12, it is preferred that the bending portion has a gentle angle both in the top surface of the heat sink 1 and the lead frame 3 because of the same reason as that described in the third and fifth preferred embodiments.

<7. Seventh Preferred Embodiment>

Figure 13:
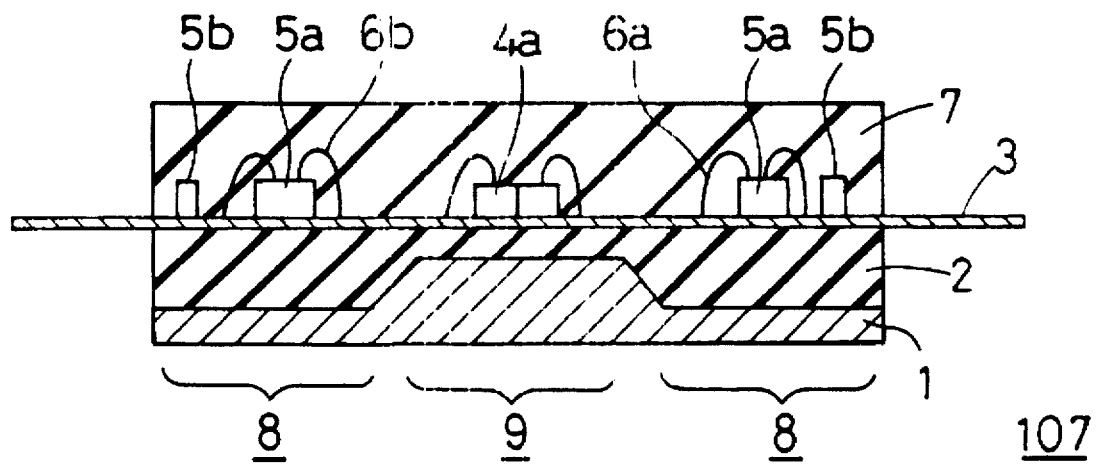
FIG. 13 is a front sectional view of a device of a seventh preferred embodiment.

FIG. 13 is a front sectional view showing the structure of a semiconductor power module according to a seventh preferred embodiment. Similarly to the fourth preferred embodiment, the power circuit 9 is provided in the center in this module 107, and the control circuit 8 is disposed being divided on both sides thereof. At the same time, in the same way as the fifth preferred embodiment, the lead frame 3 is flat and the top surface of the heat sink 1, i.e., the surface facing the lead frame 3, has a difference in level so that the thickness of the highly heat conducting resin 2 differs by steps between the control circuit 8 and the power circuit 9.

Accordingly, the module 107 simultaneously realizes the advantages both of the fourth and fifth preferred embodiments. That is to say, the power circuit 9 disposed in the center provides the advantage that the radiation efficiency of the loss heat produced in the power circuit 9 is high. Furthermore, as the creepage distance between the external terminals 15 and 17 and the heat sink 1 is long, the breakdown voltage between the lead frame 3 and the heat sink 1 is further enhanced. Moreover, since the lead frame 3 has no difference in level and is flat over both the control circuit 8 and the power circuit 9, affixing the elements such as the IGBT element 4a, the integrated circuit element 5a, etc. on the lead frame 3 and wire bonding with the bonding wires 6a, 6b can be performed easily.

<8. Eighth Preferred Embodiment>

Figure 14:
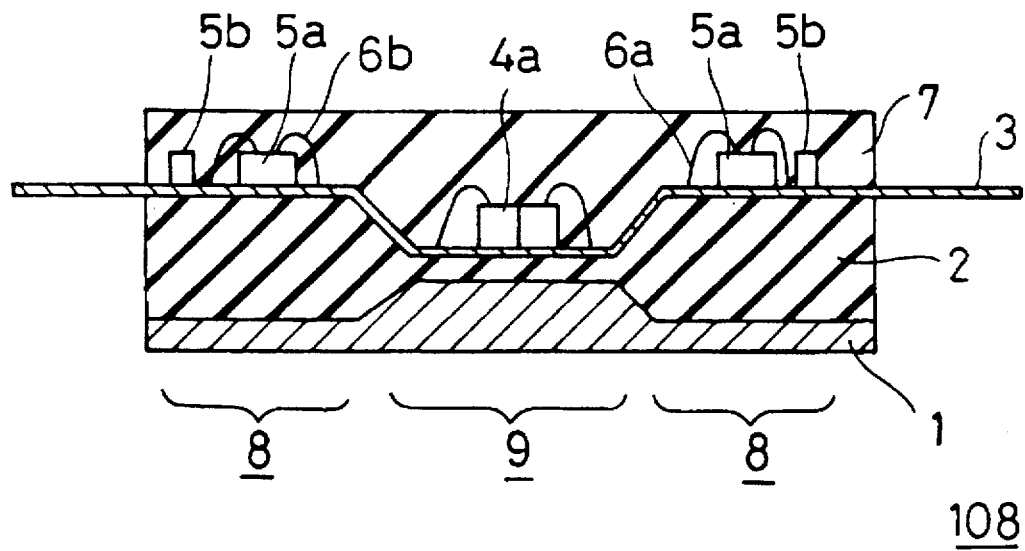
FIG. 14 is a front sectional view of a device of an eighth preferred embodiment.

FIG. 14 is a front sectional view showing the structure of a semiconductor power module according to an eighth preferred embodiment. Similarly to the fourth preferred embodiment, the power circuit 9 is provided in the center and the control circuit 8 is divided on both sides thereof in this module 108. At the same time, similarly to the sixth preferred embodiment, the difference in level is provided both in the top surface of the heat sink 1 and the lead frame 3 so that the thickness of the highly heat conducting resin 2 differs in steps between the control circuit 8 and the power circuit 9.

Hence, the module 108 simultaneously realizes the advantages both of the fourth and sixth preferred embodiments. That is to say, since the power circuit 9 is provided in the center, it has the advantage of having high radiation efficiency of the loss heat produced in the power circuit 9. Also, as the creepage distance between the external terminals 15 and 17 and the heat sink 1 is long, the breakdown voltage between the lead frame 3 and the heat sink 1 is further enhanced. Furthermore, since the difference in level is provided both in the top surface of the heat sink 1 and the lead frame 3, if the height of the module is the same, the interval between the lead frame 3 and the heat sink 1 in the control circuit 8 is further enlarged to further enhance the noise resistance of the control circuit 8.

<9. Ninth Preferred Embodiment>

Figure 15:
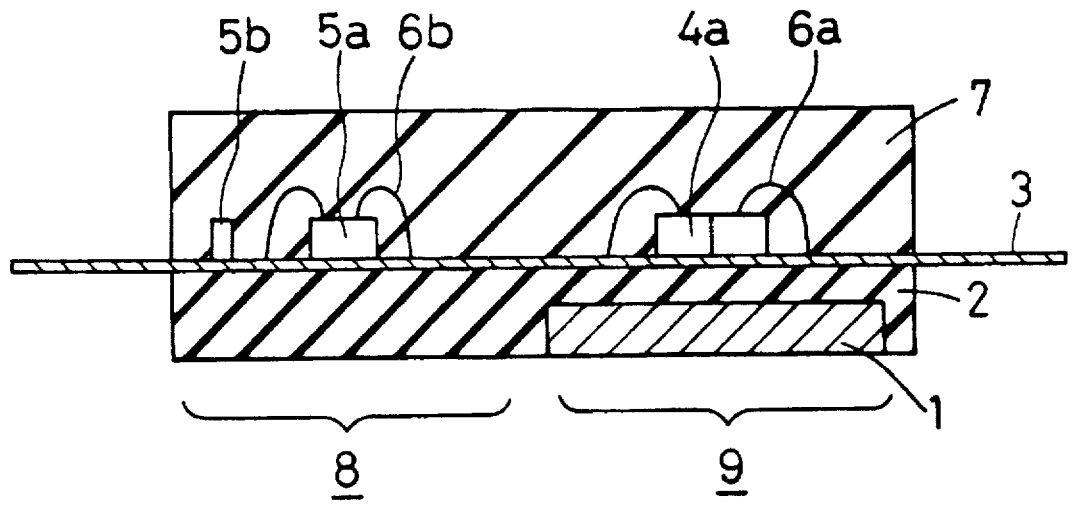
FIG. 15 is a front sectional view of a device of a ninth preferred embodiment.

FIG. 15 is a front sectional view showing the structure of a semiconductor power module according to a ninth preferred embodiment. This module 109 is characteristically different from the module 101 of the first preferred embodiment in that the heat sink 1 is provided only in the region occupied by the power circuit 9. That is to say, in the module 109, part of the heat sink 1 which has a relatively low degree of contribution to radiation of the loss heat is removed to reduce the manufacturing cost.

At the same time, the absence of the heat sink 1 in the portion occupied by the control circuit 8 suppresses bad influence of the electric noise on the control circuit 8. That is to say, the module 109 removes the effects of the electric noise to realize stable operation of the control circuit 8 without deteriorating the heat radiating characteristic so much and it also realizes further reduction of the manufacturing cost.

<10. Tenth Preferred Embodiment>

Figure 16:
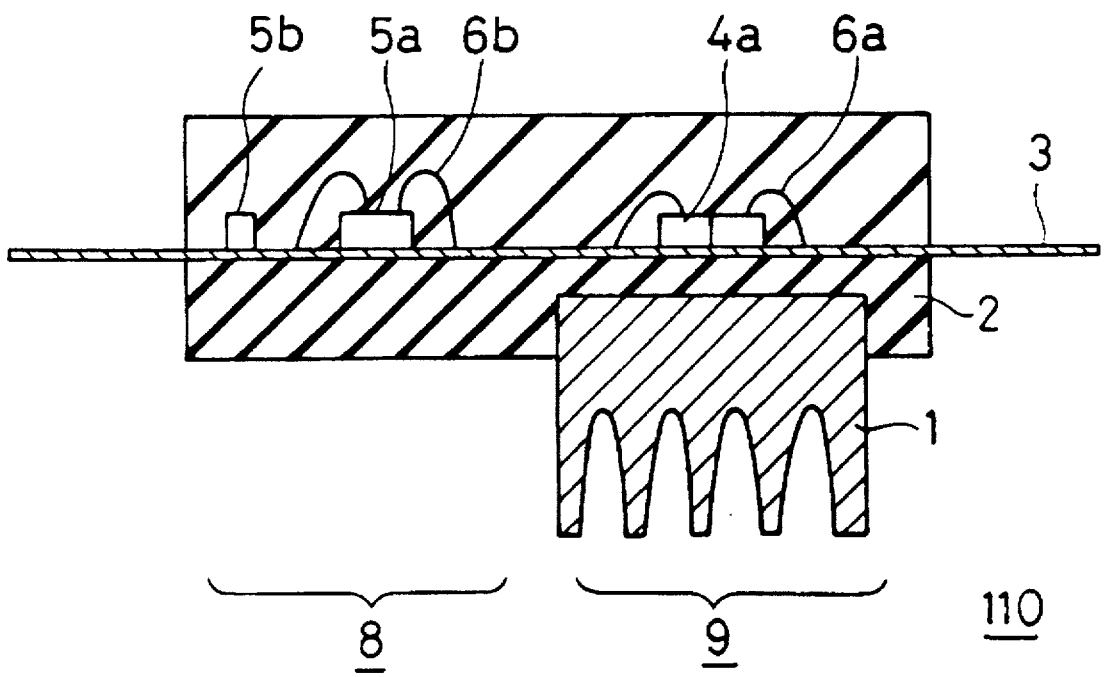
FIG. 16 is a front sectional view of an example of a device of a tenth preferred embodiment.

FIG. 16 is a front sectional view showing the structure of a semiconductor power module according to a tenth preferred embodiment. This module 110 is characteristically different from the module 109 of the ninth preferred embodiment in that the heat sink 1 is formed integral with a radiation fin.

In ordinary use of the module, the heat sink 1 is fixed to an external radiation fin. This module 110 in which the heat sink 1 serves also as a radiation fin does not require the process of attaching the heat sink 1 to the radiation fin in use. That is to say, it has the advantage of simplifying the necessary process in use. Furthermore, the contact thermal resistance generated between the heat sink 1 and the radiation fin in ordinary use is solved in the module 110, which provides the advantage of having further excellent thermal radiating characteristic.

Figure 17:
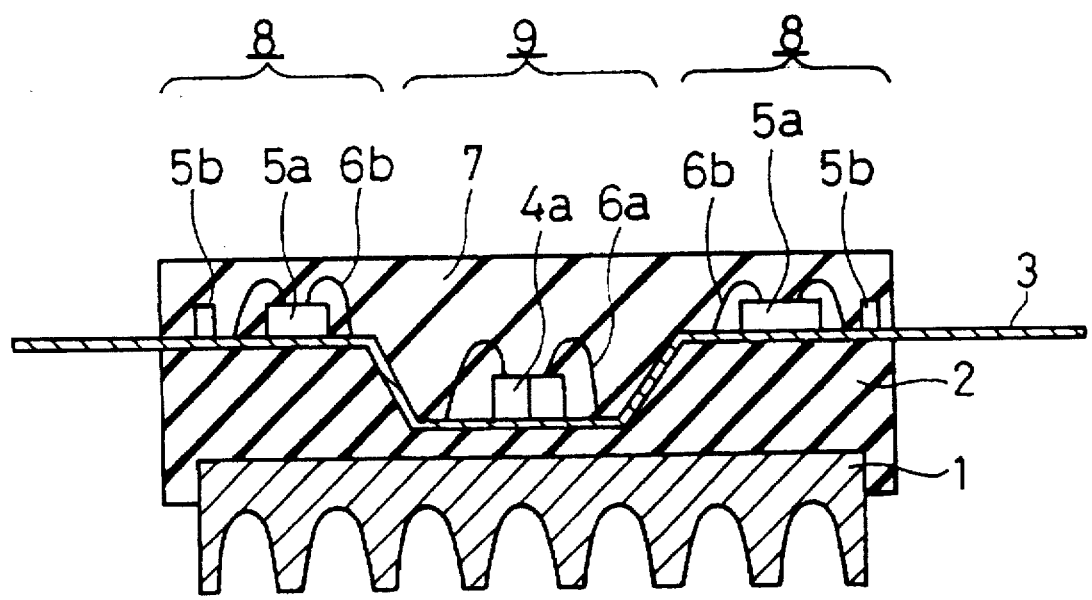
FIG. 17 is a front sectional view of another example of the device of the tenth preferred embodiment.

Although FIG. 16 shows the example in which the heat sink 1 is provided only in the region occupied by the power circuit 9, the heat sink 1 integrally coupled with a radiation fin may be provided over both the control circuit 8 and the power circuit 9 as shown in the front sectional view of FIG. 17, for example. The module 111 shown in FIG. 17 is an example of a device in which the heat sink 1 of the module 104 of the fourth preferred embodiment is united with the radiation fin. Similarly to the module 110, this module 111 also simplifies the process in use and further enhances the thermal radiating characteristic as the contact thermal resistance is solved.

While the invention has been described in detail, the foregoing description is in all aspects illustrative and not restrictive. It is understood that numerous other modifications and variations can be devised without departing from the scope of the invention.

We claim:

1. A semiconductor power module incorporating circuits of a power circuit having a power semiconductor element and a control circuit for controlling the power semiconductor element, comprising:

a lead frame having a first main surface and a second main surface, which forms an interconnection pattern having respective portions on which each of said power circuit and control circuit are formed and which includes external terminals for making electric connection to each of said power circuit and control circuit, wherein all of circuit elements of each of said power circuit and control circuit are respectively affixed on said first main surface;

a heat sink with thermal conductivity facing at least a first portion of said second main surface of said lead frame at which the power circuit is formed; and a first sealing resin with an electric insulating property and thermal conductivity filling a gap between said lead frame and said heat sink to electrically insulate said lead frame and said heat sink from each other and fixedly couple said lead frame and said heat sink.

2. The semiconductor power module according to claim 1, wherein said lead frame is flat at portions on which both said power circuit and said control circuit are formed.

3. The semiconductor power module according to claim 1, wherein said heat sink is arranged to further face a second portion of said second main surface of said lead frame at which said control circuit is formed.

4. The semiconductor power module according to claim 3, wherein said lead frame bends to form a difference in level between said first portion and said second portion so that said second portion is more distant from said heat sink as compared with said first portion.

5. The semiconductor power module according to claim 4, wherein said lead frame bends at an obtuse angle.

6. The semiconductor power module according to claim 4, wherein said main surface of said heat sink bends to form a difference in level between a third portion facing said first portion and a fourth portion facing said second portion, with said fourth portion being more distant from said lead frame as compared with said third portion.

7. The semiconductor power module according to claim 4, wherein said second portion is divided into third and fourth portions and said power circuit and said control circuit are arranged so that said first portion is interposed between said third and fourth portions, and said external terminals protrude from said third and fourth portions in a direction opposite to said first portion.

8. The semiconductor power module according to claim 3, wherein said lead frame is flat over the first and second portions on which both of said power circuit and said control circuit are formed, and said first surface of said heat sink bends to form a difference in level between a third portion facing said first portion and a fourth portion facing said second portion with said fourth portion being more distant from said lead frame as compared with said third portion.

9. The semiconductor power module according to claim 8, wherein said first surface of said heat sink bends at an obtuse angle.

10. The semiconductor power module according to claim 8, wherein said first sealing resin includes an epoxy resin with filler of alumina mixed therein.

11. The semiconductor power module according to claim 8, wherein said first sealing resin includes an epoxy resin with filler of aluminum nitride mixed therein.

12. The semiconductor power module according to claim 11, further comprising a second sealing resin for sealing in said circuit elements each belonging to each of said power circuit and said control circuit respectively.

13. The semiconductor power module according to claim 12, wherein said second sealing resin includes an epoxy resin.

14. The semiconductor power module according to claim 13, wherein said lead frame includes copper.

15. The semiconductor power module according to claim 14, wherein said heat sink includes copper.

16. The semiconductor power module according to claim 15, wherein said power semiconductor element is a power switching element for turning on and off a main current.

17. The semiconductor power module according to claim 16, wherein said control circuit includes a driving circuit for driving said power switching element and a protection circuit for protecting said power switching element from damage when an abnormality occurs.

18. The semiconductor power module according to claim 3, wherein said second portion is divided into third and fourth portions and said power circuit and said control circuit are arranged so that said first portion is interposed between said third and fourth portions.

19. The semiconductor power module according to claim 1, wherein said heat sink is provided only in a region of said lead frame facing the first portion corresponding to said power circuit.

20. The semiconductor power module according to claim 1, wherein a side of said heat sink opposite to said first surface is fin shaped.

* * * * *